United States Patent
Jeon

(10) Patent No.: US 12,356,690 B2
(45) Date of Patent: Jul. 8, 2025

(54) TRIPLE STRUCTURE CELL AND ELEMENT INCLUDING THE SAME

(71) Applicant: Korea Advanced Institute of Science and Technology, Daejeon (KR)

(72) Inventor: Sanghun Jeon, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 17/721,797

(22) Filed: Apr. 15, 2022

(65) Prior Publication Data

US 2022/0336595 A1 Oct. 20, 2022

(30) Foreign Application Priority Data

Apr. 15, 2021 (KR) .................. 10-2021-0049085

(51) Int. Cl.
| | | |
|---|---|---|
| *H10D 64/01* | (2025.01) | |
| *H10D 64/00* | (2025.01) | |
| *H10D 64/68* | (2025.01) | |

(52) U.S. Cl.
CPC ......... *H10D 64/033* (2025.01); *H10D 64/118* (2025.01); *H10D 64/689* (2025.01)

(58) Field of Classification Search
None
See application file for complete search history.

(56) References Cited

U.S. PATENT DOCUMENTS

2022/0157833 A1* 5/2022 Kobayashi ............ H10B 51/20

OTHER PUBLICATIONS

Hwang et al. "Effect of Insertion of Dielectric Layer on the Performance of Hafnia Ferroelectric Devices" IEEE Feb. 2021 (Year: 2021).*
Gaddam et al. "Insertion of HfO2 Seed/Dielectric Layer to the Ferroelectric HZO Films for Heightened Remanent Polarization in MFM Capacitors" IEEE Feb. 2020. (Year: 2020).*
Lehninger et al. "Back-End-of-Line Compatible Low-Temperature Furnace Anneal for Ferroelectric Hafnium Zirconium Oxide Formation" Phys. Status Solidi A 2020, 217, 1900840 (Year: 2017).*

* cited by examiner

*Primary Examiner* — Xiaoming Liu
(74) *Attorney, Agent, or Firm* — BKRIP LLC

(57) ABSTRACT

Disclosed is a triple structure cell and an element including the same. The ferroelectric cell of the triple structure includes a polarizable material layer, a top dielectric layer disposed on the polarizable material layer, and a bottom dielectric layer disposed under the polarizable material layer.

15 Claims, 7 Drawing Sheets

210: $TiO_2/HZO/HfO_2$
220: $ZrO_2/HZO/HfO_2$
230: $SiO_2/HZO/HfO_2$
240: HZO

210: $TiO_2$/HZO/$HfO_2$
220: $ZrO_2$/HZO/$HfO_2$
230: $SiO_2$/HZO/$HfO_2$
240: HZO

210: $TiO_2/HZO/HfO_2$
220: $ZrO_2/HZO/HfO_2$
230: $SiO_2/HZO/HfO_2$
240: HZO

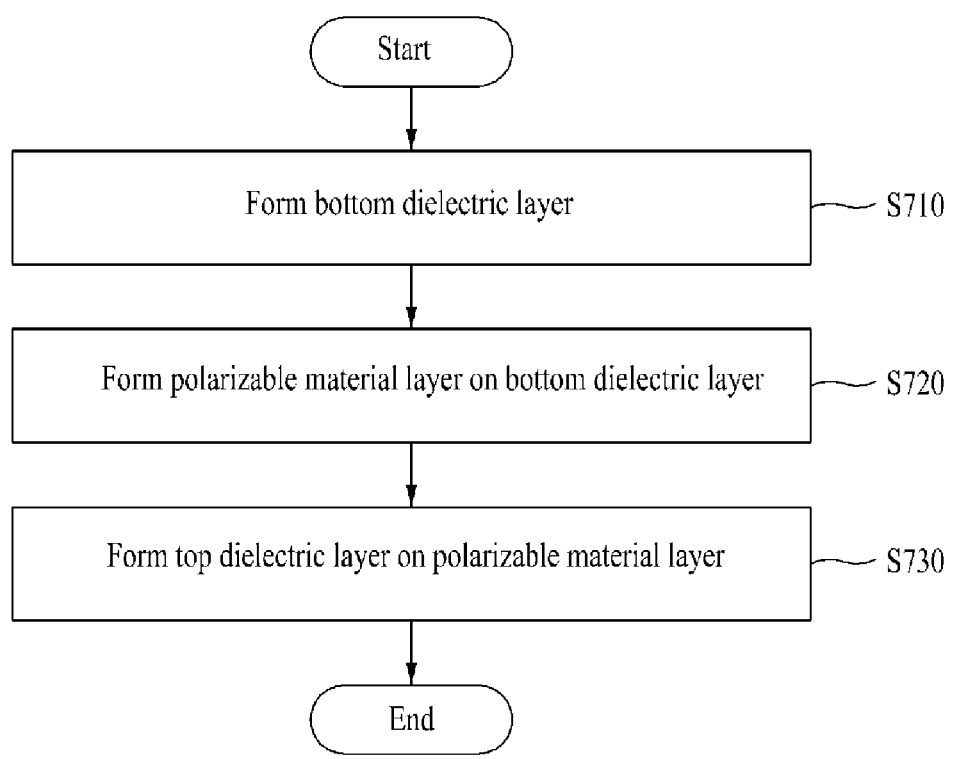

TRIPLE STRUCTURE CELL AND ELEMENT INCLUDING THE SAME

CROSS-REFERENCE TO RELATED APPLICATIONS

This application claims priority under 35 U.S.C. § 119 to Korean Patent Application No. 10-2021-0049085 filed on Apr. 15, 2021, in the Korean Intellectual Property Office, the disclosure of which is incorporated by reference herein in its entirety.

BACKGROUND

Embodiments of the present disclosure described herein relate to a triple structure cell and an element including the same.

A cell including $HfO_2$-based polarizable material may be used in various fields such as a memory, a display, a sensor, an a technology for generating and storing energy due to CMOS compatibility, sufficient residual polarization, high scalability, and ease of application of 3D technology.

To achieve excellent ferroelectric properties (residual polarization) through formation of an orthorhombic phase (o-phase), a cell including such the $HfO_2$-based polarizable material requires a heat treatment process of performing crystallization at a high annealing temperature (e.g., 500° C.).

Moreover, a double structure for achieving excellent ferroelectric properties is applied to the cell including the $HfO_2$-based polarizable material. A double structure cell is composed of a polarizable material layer formed of hafnium zirconium oxide (HZO) and a dielectric layer formed of a dielectric oxide such as $Al_2O_3$, $ZrO_2$, $HfO_2$, and $Ta_2O_5$ while being disposed under the polarizable material layer, thereby improving ferroelectric properties by suppressing an oxide vacancy of the polarizable material layer through the dielectric layer.

However, the double structure cell also requires a heat treatment process to be crystallized at a high annealing temperature (e.g., 500° C.). Both a single layer cell and a double structure cell may suffer from degradation due to high-temperature heat treatment processes and integration limitations in a back end of line (BEOL) circuit of CMOS technologies.

Accordingly, it is necessary to propose a technology of applying a low-temperature heat treatment process to the crystallization of a cell including a polarizable material.

SUMMARY

Embodiments of the present disclosure provide a triple structure cell such that ferroelectric properties are implemented even with a low-temperature heat treatment process, and an element including the same.

Embodiments of the present disclosure provide a triple structure cell that reduces leakage current density, improves durability, and improves a lifespan, and an element including the same.

However, the technical problems to be solved by the present disclosure are not limited to the above problems, and may be variously expanded without departing from the technical spirit and scope of the present disclosure.

According to an embodiment, a triple structure cell includes a polarizable material layer, a top dielectric layer disposed on the polarizable material layer, and a bottom dielectric layer disposed under the polarizable material layer.

According to an aspect, the top dielectric layer induces tension in the polarizable material layer through a high thermal expansion coefficient such that an orthorhombic phase (o-phase) of the polarizable material layer is improved.

According to another aspect, the top dielectric layer is formed of $TiO_2$.

According to still another aspect, the bottom dielectric layer is formed of a material for suppressing an oxide vacancy at a boundary with the polarizable material layer.

According to yet another aspect, the bottom dielectric layer is formed of $HfO_2$.

According to yet another aspect, the polarizable material layer is formed of hafnium zirconium oxide (HZO).

According to yet another aspect, the triple structure cell is crystallized through a low-temperature heat treatment process to implement excellent ferroelectric properties.

According to yet another aspect, the low-temperature heat treatment process is a rapid thermal annealing process having a temperature condition of 350° C. to 400° C.

According to an embodiment, a method of manufacturing a triple structure cell includes forming a bottom dielectric layer, forming a polarizable material layer on the bottom dielectric layer, and forming a top dielectric layer on the polarizable material layer.

According to an aspect, the forming of the top dielectric layer includes forming the top dielectric layer such that an o-phase of the polarizable material layer is improved by inducing tension in the polarizable material layer through a high thermal expansion coefficient.

According to another aspect, the forming of the top dielectric layer includes forming the top dielectric layer with $TiO_2$.

According to still another aspect, the forming of the bottom dielectric layer includes forming the bottom dielectric layer with a material for suppressing an oxide vacancy at a boundary with the polarizable material layer.

According to yet another aspect, the method of manufacturing the triple structure cell further includes implementing ferroelectric properties in the triple structure cell by performing a low-temperature heat treatment process on the triple structure cell.

According to yet another aspect, the low-temperature heat treatment process is a rapid thermal annealing process having a temperature condition of 350° C. to 400° C.

According to an embodiment, an element includes a top electrode, a bottom electrode, and a triple structure cell interposed between the top electrode and the bottom electrode. The triple structure cell includes a polarizable material layer, a top dielectric layer disposed on the polarizable material layer, and a bottom dielectric layer disposed under the polarizable material layer.

BRIEF DESCRIPTION OF THE FIGURES

The above and other objects and features of the present disclosure will become apparent by describing in detail embodiments thereof with reference to the accompanying drawings.

FIG. 7 is a flowchart illustrating a method of manufacturing the triple structure cell shown in FIG. 1.

DETAILED DESCRIPTION

Figure 1:
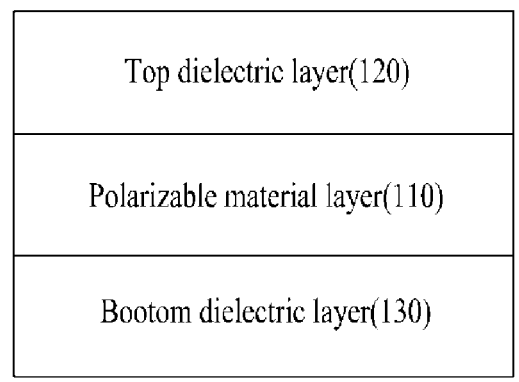
FIG. 1 is a cross-sectional view illustrating a triple structure cell, according to an embodiment.

Hereinafter, a description will be given in detail for embodiments of the present disclosure with reference to the following drawings. However, the present disclosure are not limited or restricted by the embodiments. Further, the same reference signs/numerals in the drawings denote the same members.

Furthermore, the terminologies used herein are used to properly express the embodiments of the present disclosure, and may be changed according to the intentions of a viewer or the manager or the custom in the field to which the present disclosure pertains. Therefore, definition of the terminologies should be made according to the overall disclosure set forth herein. For example, in the specification, the singular forms include plural forms unless particularly mentioned. Furthermore, the terms "comprises" and/or "comprising" used herein does not exclude presence or addition of one or more other components, steps, operations, and/or elements in addition to the aforementioned components, steps, operations, and/or elements.

Moreover, it should be understood that various embodiments of the present disclosure are not necessarily mutually exclusive although being different from each other. For example, specific shapes, structures, and characteristics described herein may be implemented in other embodiments without departing from the spirit and scope of the present disclosure in relation to one embodiment. Besides, it should be understood that the location, arrangement, or configuration of individual components in each of presented categories of an embodiment may be changed without departing from the spirit and scope of the present disclosure.

Figure 2:
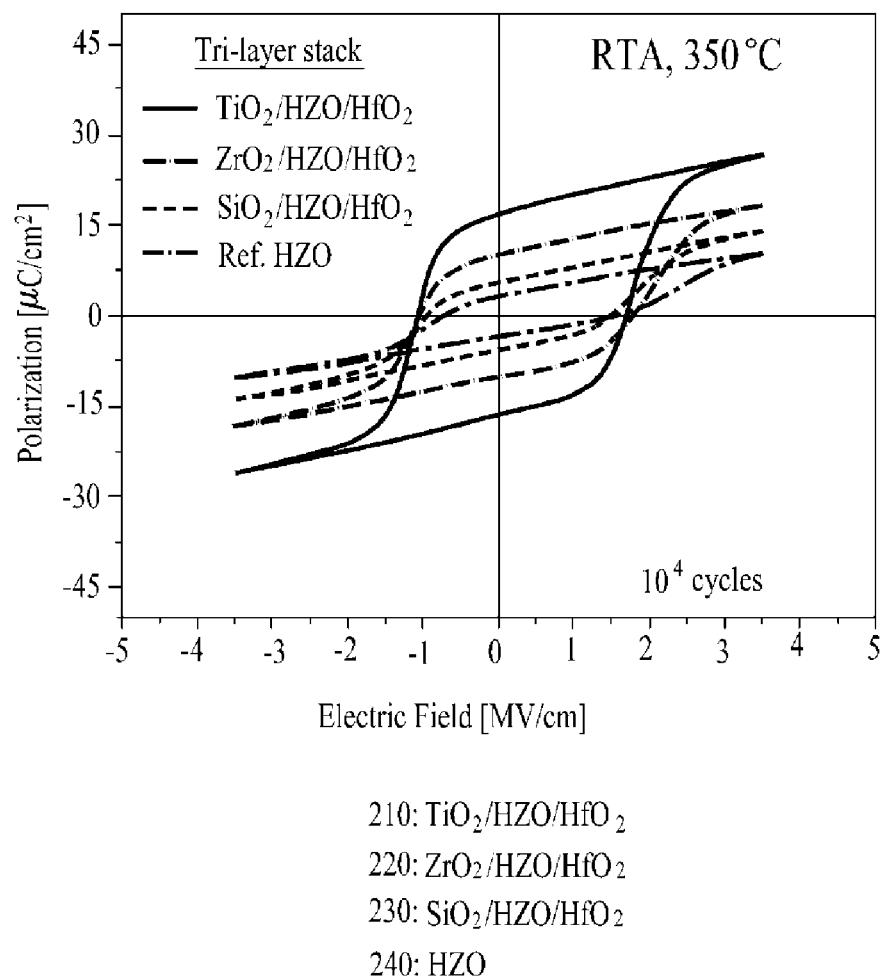
FIGS. 2 and 3 are views for describing a material for forming a top dielectric layer included in the triple structure cell shown in FIG. 1.
Figure 3:
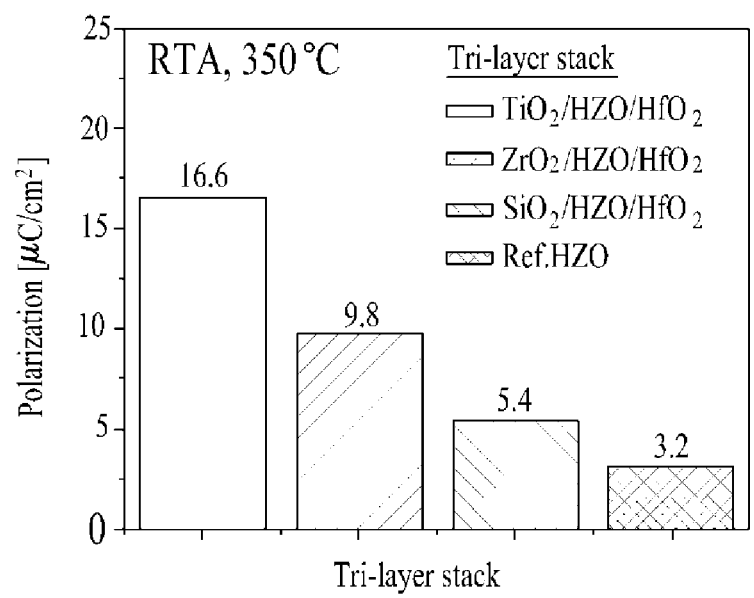
Figure 4:
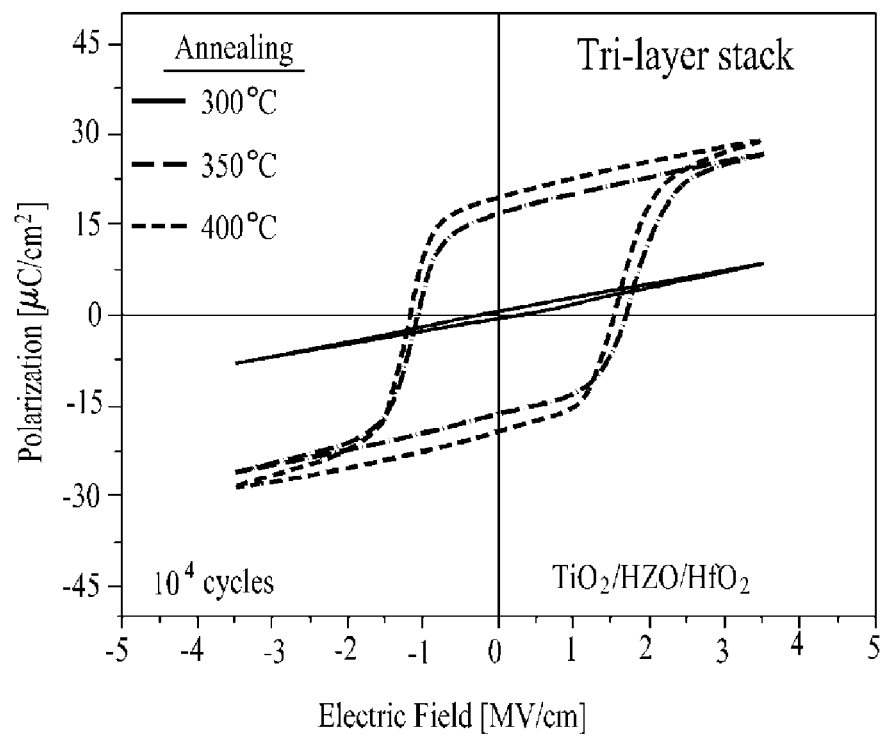
FIG. 4 is a view for describing a temperature condition of a low-temperature heat treatment process performed in a process of manufacturing the triple structure cell shown in FIG. 1.
Figure 5:
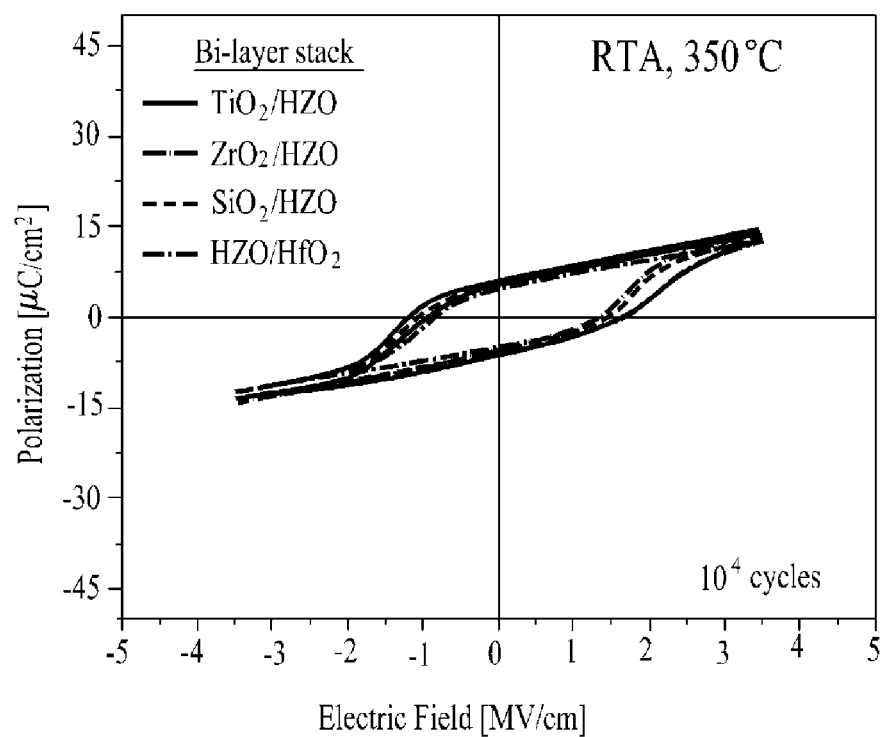
FIGS. 5 and 6 are views for comparatively describing improved ferroelectric properties of the triple structure cell shown in FIG. 1.
Figure 6:
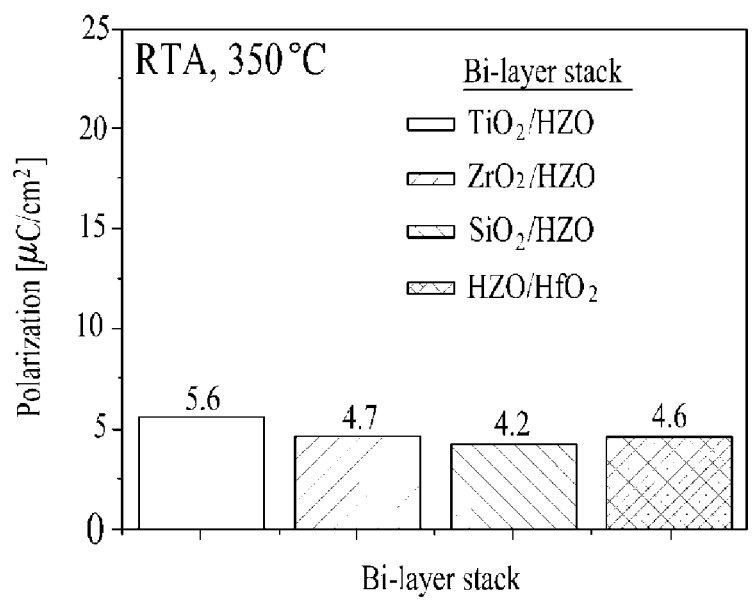

FIG. 1 is a cross-sectional view illustrating a triple structure cell, according to an embodiment. FIGS. 2 and 3 are views for describing a material for forming a top dielectric layer included in the triple structure cell shown in FIG. 1. FIG. 4 is a view for describing a temperature condition of a low-temperature heat treatment process performed in a process of manufacturing the triple structure cell shown in FIG. 1. FIGS. 5 and 6 are views for comparatively describing improved ferroelectric properties of the triple structure cell shown in FIG. 1.

Referring to FIG. 1, a triple structure cell 100 according to an embodiment may have a triple structure by including a polarizable material layer 110, a top dielectric layer 120, and a bottom dielectric layer 130.

Because the polarizable material layer 110 has ferroelectric or antiferroelectric properties, the polarizable material layer 110 has a polarization state, which is capable of being arbitrarily set, from among at least two or more polarization states. The polarizable material layer 110 may be formed of an $HfO_2$ or ZrO-based material, a compound thereof, or a material doped with other elements (e.g., HZO such as $Hf_xZr_{1-x}O_2$, that is, $HfO_2$ where Zr is doped).

While being disposed on the polarizable material layer 110, the top dielectric layer 120 may induce tension in the polarizable material layer 110 through a high thermal expansion coefficient, thereby improving an orthorhombic phase (o-phase) of the polarizable material layer 110. To this end, the top dielectric layer 120 may be formed of a material having the high thermal expansion coefficient. Hereinafter, a material for forming the top dielectric layer 120 may have the high thermal expansion coefficient. This may mean that the material has a thermal expansion coefficient higher than the thermal expansion coefficient of the polarizable material layer 110 or may mean that the material has a thermal expansion coefficient that is not less than a threshold capable of inducing tension in the polarizable material layer 110.

Referring to FIGS. 2 to 3 in relation to the material for forming the top dielectric layer 120, it may be seen that ferroelectric properties thus remarkably high are implemented in a case (210) where the top dielectric layer 120 is formed of $TiO_2$, as compared to a case (220) where the top dielectric layer 120 is formed of $ZrO_2$, a case (230) where the top dielectric layer 120 is formed of $SiO_2$, and a case (240) where a cell has a single layer structure including only a polarizable material layer. The reason is that a thermal expansion coefficient of $TiO_2$, which is $5*10^{-5}K^{-1}$, is higher than a thermal expansion coefficient of $ZrO_2$, which is $8*10^{-6}K^{-1}$, or a thermal expansion coefficient of $SiO_2$, which is $0.5*10^{-6}K^{-1}$. Accordingly, it is desirable that the top dielectric layer 120 is formed of $TiO_2$. However, it is not limited thereto. For example, the top dielectric layer 120 may also be formed of $ZrO_2$ or $SiO_2$ in consideration of the purpose and other advantages of a triple structure cell.

While being disposed under the polarizable material layer 110, the bottom dielectric layer 130 may suppress an oxide vacancy at a boundary with the polarizable material layer 110. To this end, the bottom dielectric layer 130 may be formed of a dielectric oxide, such as $HfO_2$ capable of supplying oxygen to the polarizable material layer 110. However, it is not limited thereto. For example, the bottom dielectric layer 130 may be formed of not only $HfO_2$ but also a dielectric oxide such as $Al_2O_3$, $ZrO_2$, and $Ta_2O_5$.

As such, because the triple structure cell 100 includes the top dielectric layer 120 in addition to the bottom dielectric layer 130, the triple structure cell 100 is also crystallized through a low-temperature heat treatment process to implement excellent ferroelectric properties. This is proven through a residual polarization value of the triple structure cell 100 shown in FIGS. 2 to 3.

Here, the low-temperature heat treatment process performed by the triple structure cell 100 may be a rapid thermal annealing process having a temperature condition of 350° C. to 400° C. In this regard, referring to FIG. 4, it may be seen that excellent ferroelectric properties are implemented when a temperature condition of the rapid thermal annealing process is 350° C. or 400° C. other than 300° C. Accordingly, the low-temperature heat treatment process performed by the triple structure cell 100 may be determined under a temperature condition of 350° C. to 400° C. In addition, the low-temperature heat treatment process performed by the triple structure cell 100 may have a nitrogen environment condition and a time condition of 1 minute.

As such, the triple structure cell 100 not only improves ferroelectric properties by suppressing an oxide vacancy at a boundary with the polarizable material layer 110 through the bottom dielectric layer 130, but also improves the o-phase of the polarizable material layer 110 by inducing tension in the polarizable material layer 110 through the high thermal expansion coefficient of the top dielectric layer 120, thereby further improving a lifespan by improving the ferroelectric properties, reducing leakage current density, and improving durability.

The excellent ferroelectric properties implemented by the triple structure cell 100 may be effectively understood as compared with the ferroelectric properties of a cell having a conventional double structure. For example, as compared to ferroelectric properties of a cell having a double structure as shown in FIGS. 5 to 6, it may be seen that the triple structure cell 100 implements remarkably high ferroelectric properties as shown in FIGS. 2 and 3.

The triple structure cell 100 described above may be used as a memory element, such as being used as a capacitor in a MOSFET by configuring an element with the top electrode and a bottom electrode while being interposed between a top electrode (not shown) and a lower electrode (not shown). However, it is not limited thereto. For example, it may also be used in fields such as a display, a sensor, and a technology for generating and storing energy by further combining with other components.

FIG. 7 is a flowchart illustrating a method of manufacturing the triple structure cell shown in FIG. 1. Hereinafter, it is assumed that a manufacturing method described with reference to FIG. 7 is performed by an automated and mechanized manufacturing system. What is manufactured as the performed result may be the triple structure cell 100 described with reference to FIG. 1.

Referring to FIG. 7, in operation S710, the manufacturing system may form the bottom dielectric layer 130. In more detail, the manufacturing system may form the bottom dielectric layer 130 with a dielectric oxide such as $HfO_2$ so as to suppress oxide vacancy at a boundary with the polarizable material layer 110 while the bottom dielectric layer 130 is disposed under the polarizable material layer 110. For example, the manufacturing system may form the bottom dielectric layer 130 with a thickness of 10 angstroms (Å) by using plasma-enhanced atomic layer deposition.

Next, in operation S720, the manufacturing system may form the polarizable material layer 110 on the bottom dielectric layer 130. In detail, the manufacturing system may form the polarizable material layer 110 with hafnium zirconium oxide (e.g., HZO such as $Hf_xZr_{1-x}O_2$, that is, $HfO_2$ where Zr is doped). For example, the manufacturing system may form the polarizable material layer 110 with a thickness of 100 Å based on Hf precursor, Zr precursor and oxygen source by using the plasma-enhanced atomic layer deposition.

Afterwards, in operation S730, the manufacturing system may form the top dielectric layer 120 on the polarizable material layer 110. In more detail, the manufacturing system may form the top dielectric layer 120 with $TiO_2$ so as to improve an orthorhombic phase (o-phase) of the polarizable material layer 110 by inducing tension in the polarizable material layer 110 through a high thermal expansion coefficient. For example, the manufacturing system may form the top dielectric layer 120 with a thickness of 10 (angstroms) Å by using the plasma-enhanced atomic layer deposition.

Furthermore, although not shown as a separate operation, the manufacturing system performs operation S710 to operation S730 and then performs a low-temperature heat treatment process on the triple structure cell 100, thereby implementing ferroelectric properties in the triple structure cell 100. Here, the low-temperature heat treatment process may be a rapid thermal annealing process having a temperature condition of 350° C. to 400° C.

While a few embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

Embodiments provide a triple structure cell such that ferroelectric properties are implemented even with a low-temperature heat treatment process, and an element including the same.

Furthermore, embodiments provide a triple structure cell that reduces leakage current density, improves durability, and improves a lifespan, and an element including the same.

However, the effects of the present disclosure are not limited to the effects, and may be variously expanded without departing from the spirit and scope of the present disclosure.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A triple structure cell comprising:
   a polarizable material layer having a thickness of 100 Å formed by plasma enhanced atomic layer deposition;
   a top dielectric layer disposed on the polarizable material layer and inducing tension on the polarizable material layer, the top dielectric layer having a thickness of 10 Å formed by plasma enhanced atomic layer deposition; and
   a bottom dielectric layer disposed under the polarizable material layer having a thickness of 10 Å formed by plasma enhanced atomic layer deposition.

2. The triple structure cell of claim 1, wherein the top dielectric layer induces tension in the polarizable material layer through a high thermal expansion coefficient such that an orthorhombic phase (o-phase) of the polarizable material layer is improved.

3. The triple structure cell of claim 2, wherein the top dielectric layer is formed of $TiO_2$.

4. The triple structure cell of claim 1, wherein the bottom dielectric layer is formed of a material for suppressing an oxide vacancy at a boundary with the polarizable material layer.

5. The triple structure cell of claim 4, wherein the bottom dielectric layer is formed of $HfO_2$.

6. The triple structure cell of claim 1, wherein the polarizable material layer is formed of hafnium zirconium oxide (HZO).

7. The triple structure cell of claim 1, wherein the triple structure cell is crystallized through a low-temperature heat treatment process to implement excellent ferroelectric properties.

8. The triple structure cell of claim 7, wherein the low-temperature heat treatment process is a rapid thermal annealing process having a temperature condition of 350° C. to 400° C.

9. A method of manufacturing a triple structure cell, the method comprising:
   forming a bottom dielectric layer having a thickness of 10 Å by plasma enhanced atomic layer deposition;

forming a polarizable material layer on the bottom dielectric layer;

forming a top dielectric layer on the polarizable material layer having a thickness of 10 Å by plasma enhanced atomic layer deposition; and inducing tension on the polarizable material layer with the top dielectric layer.

10. The method of claim 9, wherein the forming of the top dielectric layer includes:

forming the top dielectric layer such that an o-phase of the polarizable material layer is improved by inducing tension in the polarizable material layer through a high thermal expansion coefficient.

11. The method of claim 10, wherein the forming of the top dielectric layer includes:

forming the top dielectric layer with $TiO_2$.

12. The method of claim 10, wherein the forming of the bottom dielectric layer includes:

forming the bottom dielectric layer with a material for suppressing an oxide vacancy at a boundary with the polarizable material layer.

13. The method of claim 10, further comprising:

implementing ferroelectric properties in the triple structure cell by performing a low-temperature heat treatment process on the triple structure cell.

14. The method of claim 13, wherein the low-temperature heat treatment process is a rapid thermal annealing process having a temperature condition of 350° C. to 400° C.

15. An element comprising:

a top electrode:

a bottom electrode; and a triple structure cell interposed between the top electrode and the bottom electrode, wherein the triple structure cell includes:

a polarizable material layer having a thickness of 100 Å formed by plasma enhanced atomic layer deposition;

a top dielectric layer disposed on the polarizable material layer and inducing tension on the polarizable material layer, the top dielectric layer having a thickness of 10 Å formed by plasma enhanced atomic layer deposition; and a bottom dielectric layer disposed under the polarizable material layer having a thickness of 10 Å formed by plasma enhanced atomic layer deposition; and wherein the triple structure cell is crystallized through a rapid thermal annealing process having a temperature condition of 350° C. to 400° C. in a nitrogen environment condition and a time condition of about 1 minute.

* * * * *